United States Patent
Chiang

(10) Patent No.: US 7,254,206 B2
(45) Date of Patent: Aug. 7, 2007

(54) DEVICE AND METHOD FOR COMMA DETECTION AND WORD ALIGNMENT IN SERIAL TRANSMISSION

(75) Inventor: Chin-Yi Chiang, HsinTien (TW)

(73) Assignee: Via Technologies, Inc., Hsin Tien (TW)

( * ) Notice: Subject to any disclaimer, the term of this patent is extended or adjusted under 35 U.S.C. 154(b) by 749 days.

(21) Appl. No.: 10/287,673

(22) Filed: Nov. 5, 2002

(65) Prior Publication Data

US 2003/0161429 A1    Aug. 28, 2003

(30) Foreign Application Priority Data

Feb. 22, 2002   (TW)  ................................ 91103224

(51) Int. Cl.
*H04L 25/00*    (2006.01)

(52) U.S. Cl. ...................... 375/371; 375/354

(58) Field of Classification Search ................ 375/371, 375/354
See application file for complete search history.

(56) References Cited

U.S. PATENT DOCUMENTS 4,329,708 A  *  5/1982  Yamamoto et al. ......... 348/617
4,364,081 A  *  12/1982  Hashimoto et al. ......... 348/617

* cited by examiner

*Primary Examiner*—Khai Tran
(74) *Attorney, Agent, or Firm*—Arent Fox LLP

(57) ABSTRACT

The invention is applied in a gigabit network environment. During the process of converting serial data into parallel data, a method is proposed to use the comma pattern in a data pipeline architecture to select word boundaries of a correct data frame from a serial bit stream. This method is further implemented in a bit receiver with a two-stage pipeline architecture to achieve the object of increasing data transmission bandwidth and efficiency.

17 Claims, 3 Drawing Sheets

DEVICE AND METHOD FOR COMMA DETECTION AND WORD ALIGNMENT IN SERIAL TRANSMISSION

BACKGROUND OF THE INVENTION

1. Field of Invention

This invention relates to a device and method for comma detection and word alignment in serial transmission. More particularly, this invention relates to a pipeline architecture applied in a gigabit network environment for completing data comparison of comma detection and data output of word alignment in two stages during the process of converting a serial data into a parallel data. The invention is a device and method for increasing the data transmission bandwidth and efficiency.

2. Related Art

The current gigabit serial transmission network covers a wide area, including the optical network technology, the gigabit network technology, the Infiniband transmission technology, the serial ATA and the PCI Express. The data transmissions in these high-speed serial links all use 8/10 code proposed by A. X. Widmer and P. A. Franazek. Such a code set includes all 8-bit data codes (256 unique data characters) and additional special (or "K") symbols. Since this code set is inherited with the abilities of DC-balancing, limited run length coding, and error bit detection, the code set is widely used in high-speed serial transmissions. The ability of DC-balancing refers to the equality of the numbers of 1 and 0 in the serial data bits. The limited run length coding means that the number of continuous 1 or 0 does not exceed five in the serial data, ensuring correct extraction of clocks by the receiving end from the serial data stream.

In practice, the transmission end of the serial links represents a character using 10 bits in data coding. The receiving end of the serial links has to use 10 bits as the unit to perform symbol comparison. If the received symbol is the same as a code, then the symbol is interpreted as the corresponding 8-bit data. For the receiving end, it is especially important to obtain correct 10 bits for decoding. Among the code sets, some special symbols have particular bit combinations called commas. These commas are capable of making the receiver obtain correct word alignment in the serial bit stream. Since the commas are unique in coding, arbitrarily coded serial data may not have the same bit combination as the commas. The receiving end can thus determine the boundaries of words.

In the prior art, the transmitted serial data take 10 bits as a unit to represent a character. However, the boundaries of each 10 bits are determined through the comma detection so that correct conversion to parallel data is possible. Incorrect bit boundaries will result in erratic data interpretation. Therefore, a comma comparison circuit is used to detect the correct bit boundaries. Once the comparison circuit finds the correct boundaries in the serial bit stream to accomplish word alignment, the data are transmitted in a parallel way out of an output circuit. Consequently, the more time it takes to perform comma detection and word alignment, the less time is allowed for the next stage circuit to receive word data.

SUMMARY OF THE INVENTION

An objective of the present invention is to provide in a gigabit network environment a device and method for comma detection and word alignment in serial transmission through a two-stage pipeline architecture. This invention is thus capable of rapidly and correctly identify word boundaries during the process of transmitting and receiving serial bit streams, increasing the data transmission bandwidth and efficiency.

Another objective of the present invention is to provide in a gigabit network environment a method that simultaneously employs several comma detection circuits to detect the locations of commas in the pipeline architecture during the process of receiving serial bit streams, thereby extracting data with correct word boundaries in the serial bit stream. This can greatly save the time needed for the next stage device to receive data and achieve an optimized data processing.

In view of the prior art, it takes more time for the conventional gigabit network to detect word boundaries during the processing of transmitting data to a receiving end, resulting in insufficient time for the next stage device to read data.

The present invention thus provides a device and method for data transmission in a gigabit network environment. It is implemented by using a two-stage data pipeline architecture that receives serial bit streams. The present invention includes a comma detection mechanism, and a selection output mechanism. The comma detection mechanism simultaneously uses several comma detection circuits during the first stage of the data pipeline architecture to detect whether the received data contain commas and the locations thereof, thereby determining 10-bit data frames with correct word boundaries. The selection output mechanism comprises several data out selectors that selects according to the 10-bit data frames determined in the first stage the associated data out selector in the second stage to send out correct word data, for increasing the data transmission bandwidth and efficiency.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

The disclosed device and method of the present invention are widely applied in high-speed serial transmission network environments such as the optical network, the cable modem, the Infiniband transmission technology, the serial ATA and the PCI Express.

Figure 1:
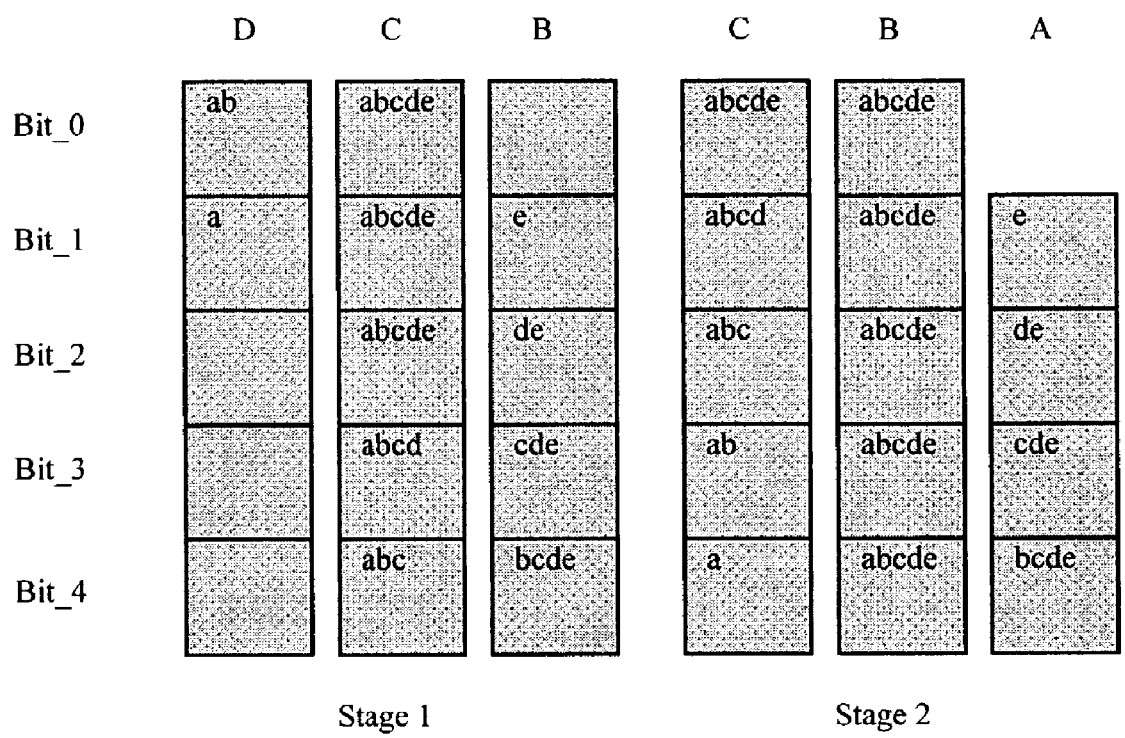
FIG. 1 is a schematic diagram of the comma pattern locations and the corresponding 10-bit data frame boundaries in a serial data stream in accordance with a 5-bit data width implemented data pipeline architecture.

With reference to FIG. 1, the pipeline architecture of the invention has two stages. In this embodiment, the pipeline architecture has four register sets A, B, C, and D. The four register sets form a shift register with 5-bit width. The triggering of the clock shifts the data from one register set to another. For example, the data in the register set D is shifted to the register set C, that in the register set C to the register set B, and so on. The input data of the register set D is from the outputs of a 5-bit SIPO (Serial-In-Parallel-Out) converter. In the two-stage pipeline design, the first stage performs data comparison of serial data comma detection in the register sets B, C and D; the second stage performs serial data word alignment and output in the register sets A, B and C.

With further reference to FIG. 1, in accordance with the disclosed pipeline architecture for comma detection and word alignment, the pipeline receives an unaligned 5-bit data from SIPO converter. Since the unaligned 5-bit data are not in parallel with correct word boundaries, they should be interpreted as 5-bit serial data. If the serial data with commas enter the pipeline architecture of the present invention, the 7-bit comma is detected in the register sets B, C and D and appears only at five possible positions. As shown in FIG. 1, the five positions a, b, c, d, and e labeled during the first stage are the five possible positions for the 7-bit commas. During this stage, five comma detection circuits are simultaneously required to perform the comma detection. The second stage uses the information of comma pattern obtained in the first stage and completes word alignment and data output in the register sets A, B and C according to the labeled positions a, b, c, d, and e. For example, when the register sets B, C, and D perform data comparison of comma detection in the first stage, the 7-bit comma patterns are detected to appear at the positions labeled by 'a' in the register sets C and D and the locations of the bit 0 can be identified. Therefore, when the register sets A, B and C perform data output of aligned words, the positions labeled by 'a' in the register sets B and C contain correct 10-bit data frame, which are then sent out. If the 7-bit comma patterns are detected to appear at positions labeled by 'b' in the register sets D, C and B, then the bit 0 can be identified. Thus, when the register sets A, B and C perform data output of aligned words, the positions labeled by 'b' in the register sets C, B and A contain correct 10-bit data frame, which are then sent out.

Figure 2:
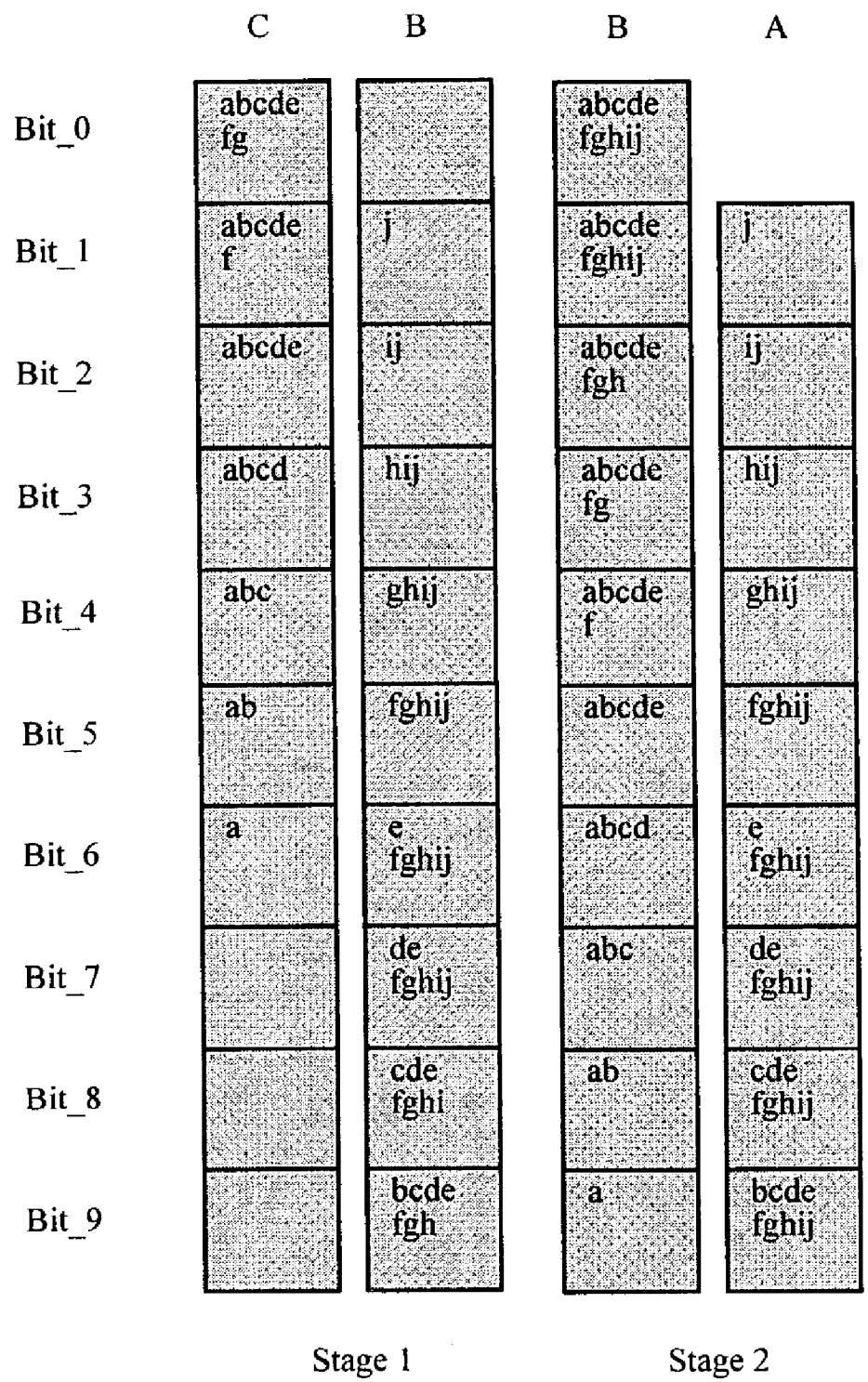
FIG. 2 is a schematic diagram of the comma pattern locations and the corresponding 10-bit data frame boundaries in a serial data stream in accordance with a 10-bit data width implemented data pipeline architecture.

In FIG. 2, the pipeline architecture in this embodiment has three register sets A, B and C. The input data of the register set C come from the output of a 10-bit SIPO converter. The 7-bit commas appear at ten possible positions a, b, c, d, e, f, g, h, i, and j. Therefore, ten comma detection circuits are required, with the same pipeline implementation as the 5-bit data width.

In the above-mentioned embodiments, the disclosed method of comma detection and word alignment for serial transmissions is implemented in a two-stage data pipeline architecture. The method comprises the following procedures:

The comma detection procedure: The positions of the 7-bit comma pattern, i.e. the locations of the bit 0, in the pipeline register sets are detected during the first stage of the data pipeline architecture. A data frame with 10-bit boundary is thus defined. The data frame defines a correct bit location of parallel data in the pipeline architecture.

The selection output procedure: The 10-bit data frame defined in the first stage of the data pipeline architecture is used to select correct parallel data from the serial data stream for output.

Figure 3:
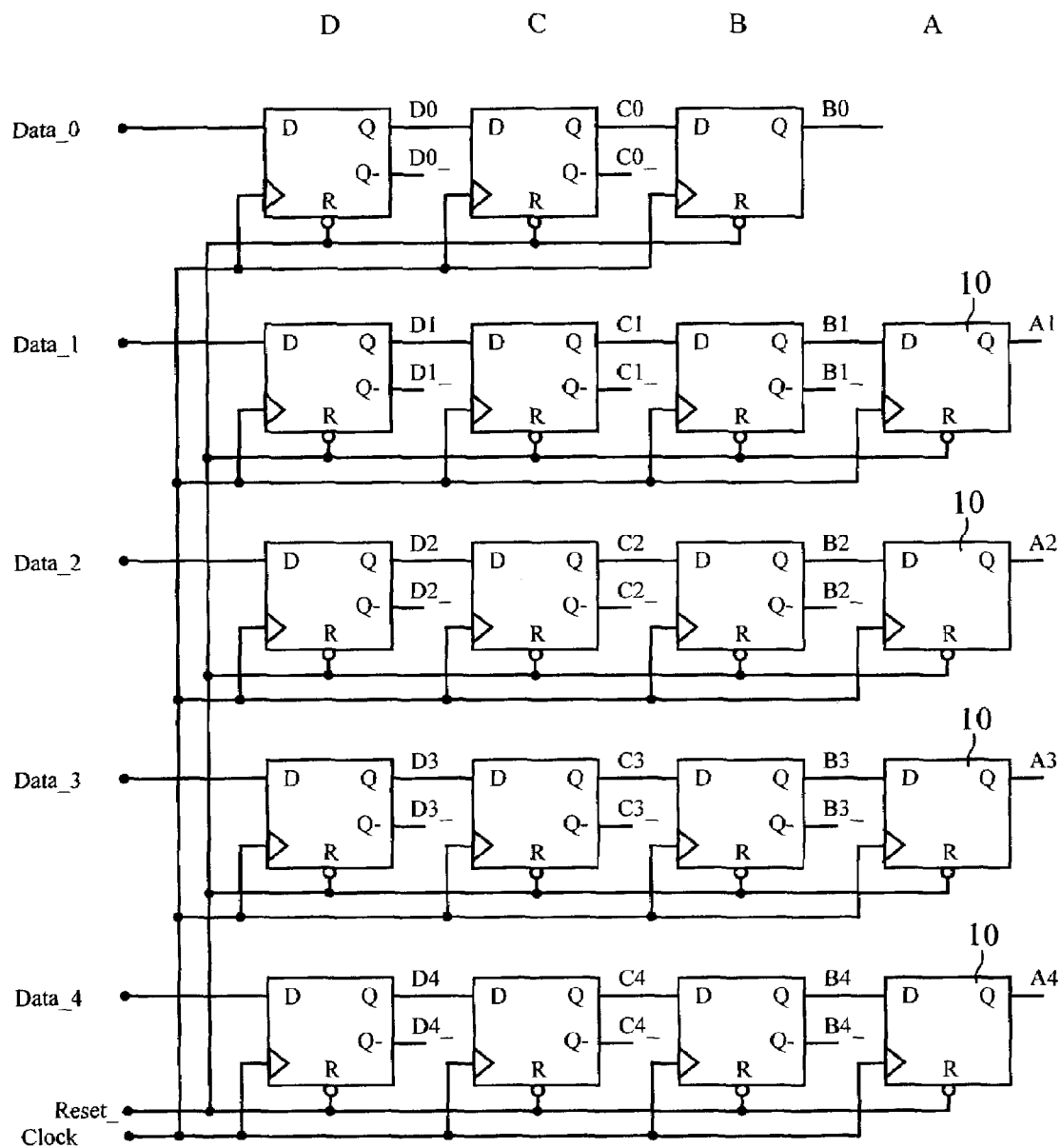
FIG. 3 is a circuit diagram of shift register architecture applied in the data pipeline architecture implemented in 5-bit data widths.

As shown in FIG. 3, the pipeline register for implementing the method of comma detection and word alignment in serial transmission is comprised of a D-type flip-flop 10. In the 5-bit width embodiment, each of the register sets A, B, C and D consists of five D-type flip-flops 10. During the first stage pipeline, the register sets B, C and D perform comma detection and find five types of 7-bit comma pattern locations. During the second stage pipeline when the register sets A, B and C perform word alignment, the register set A only needs 4 bits to extract the correct word data output from the five types of 10-bit data frames. Thus, the data register set A can be comprised of four D-type flip-flops 10.

With further reference to FIG. 3, the input data of the register set D come from a 5-bit SIPO converter. Through the triggering of the clock, the data are locked in the register set D. The bit data D0, . . . , D4 of the register set D is shifted to the register set C, the bit data C0, . . . , C4 of the register set C is shifted to the register set B, and the bit data B0, . . . , B4 of the register set B is shifted to the register set A.

With simultaneous reference to FIGS. 1 and 3, when performing data comparison of comma detection during the first stage of the data pipeline architecture, the bit data of the serial data stream enter the data register sets B, C and D and the comma patterns correspond to five different positions a, b, c, d and e in the pipelines B, C and D. For example, 7-bit comma patterns appear at the position labeled by 'a' in the pipelines D and C, meaning that the 7-bit comma pattern appear at the bit data (C0 C1 C2 C3 C4 D0 D1) corresponding to the register sets D and C. When performing data output of the word alignment in the second stage, the bit data in the register sets D, C and B are shifted to the register sets C, B and A, respectively. Five 10-bit data frames with correct word data are at five different locations a, b, c, d, and e in the pipelines C, B and A. For example, the bit data corresponding to the 10-bit boundaries of the data frames appear in the bit data (B0 B1 B2 B3 B4 C0 C1 C2 C3 C4) of the register sets B and C.

The following paragraph further illustrates the disclosed comma detection mechanism. This mechanism is implemented in the first stage of the data pipeline architecture. In the 5-bit data width embodiment, the logical operation for detecting the comma pattern is as follows:

1. COMMA=7'b0011111 or 7'b1100000
2. CommaHit_a=((C0 C1 C2 C3 C4 D0 D1)==COMMA).
3. CommaHit_b=((B4 C0 C1 C2 C3 C4 D0)==COMMA).
4. CommaHit_c=((B3 B4 C0 C1 C2 C3 C4)==COMMA).
5. CommaHit_d=((B2 B3 B4 C0 C1 C2 C3)==COMMA).
6. CommaHit_e=((B1 B2 B3 B4 C0 C1 C2)==COMMA).

In the above logical operations, line 1 defines the 7-bit comma pattern: COMMA=7'b0011111 or 7'b1100000. Lines 2 through line 6 define all possible locations of COMMA in the register sets D, C and B in the pipeline architecture. The indication signals CommaHit_a, CommaHit_b, CommaHit_c, CommaHit_d, and CommaHit_e are used to label the five possible locations of the comma pattern. When any of the indication signals is valid, it means that a 7-bit comma pattern in accordance with COMMA is found in the register sets D, C and B.

The logical operations for detecting commas are carried out during the first stage. From the comma detection indication signals, one can learn whether any comma pattern appears in the register sets D, C and B and where they are, if any. After the data pipeline architecture enters the second stage to perform word alignment, the indication signals CommaHit_a, CommaHit_b, CommaHit_c, CommaHit_d, and CommaHit_e are the selection signals of five 10-bit data frames (HitSelect_a, HitSelect_b, HitSelect_c, HitSelect_d, and HitSelect_e) in the register sets C, B and A. When CommaHit_a is true, the 10-bit data frame HitSelect_a is used to extract the parallel data. The bit data selected by the correct word data are (B0 B1 B2 B3 B4 C0 C1 C2 C3 C4).

If the first stage does not detect any comma symbol, then the bit data are extracted from the register sets C, B and A according to the previous 10-bit data frame.

Therefore, in the 5-bit data width embodiment of the present invention, a serial data stream enters the pipeline register sets D, C, B. The first stage of the data pipeline architecture performs the above-mentioned logical operation for detecting the comma pattern. The indication signals of comma detection show whether comma pattern appear and the locations of the comma pattern. Afterwards, after the serial data stream enters the pipeline register sets C, B, A in the next clock period, the second stage of the pipeline architecture performs the logical operation for word alignment selection. Bit data with correct 10-bit boundaries are then extracted according to correct 10-bit data frames from the register sets C, B, A.

In accordance with the disclosed device or bit receiver implemented with the comma detection and word alignment methods, the invention comprising: a two-stage pipeline architecture for receiving serial data streams; a comma detection logical circuit, which detects the distribution of a k-bit comma pattern when the serial data streams enter the first-stage pipeline in the pipeline architecture; and a word alignment logical circuit, which extracts an n-bit word datum in the second-stage pipeline. The locations of the n-bit word data are selected according to the locations of the k-bit comma pattern. The output data then go through an n-to-m bit conversion to generate m-bit data.

EFFECTS OF THE INVENTION

The disclosed pipeline architecture and method are implemented using a comma detection mechanism and a selection output mechanism. Such a method can rapidly detect the occurrence of comma pattern in a serial data stream after it enters a transmission receiving end and select word data corresponding to correct boundaries. Therefore, the invention can increase the data transmission bandwidth and efficiency.

Another advantage of the disclosed device and method is that, during the process of transmitting bit data of a serial data stream to a receiving end in a gigabit network environment, the data comparison and selection output processes are carried out simultaneously in a two-stage pipeline architecture, thus saving the time for word data extraction in the next-stage device. The data reading process can thus be optimized.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A device for comma detection and word alignment for n-to-m bit conversion serial transmission, the device comprising:
   a two-stage pipeline architecture composed of a plurality of register sets with h-bit data width, which receives a serial data stream;
   a comma detection logical circuit, which detects the distribution of a k-bit comma pattern in the register sets of a first-stage pipeline; and
   a word alignment logical circuit, which extracts an n-bit word data in the register sets of a second-stage pipeline, and the output data go through an n-to-m bit conversion to obtain an m-bit data,
   wherein when the serial data streams enter the first stage pipeline, said comma detection logical circuit detects the location of a k-bit comma pattern and then a comma detection indication signal is transmitted to said word alignment logical circuit, the locations of the n-bit word data in a second-stage pipeline are selected and extracted according to the locations of the k-bit comma pattern in said first-stage pipeline.

2. The device of claim 1, wherein said pipeline architecture is comprised of D-type flip-flop.

3. The device of claim 1, wherein k<n.

4. The device of claim 3, wherein k=7, n=10, and m=8.

5. The device of claim 1, wherein after said serial data stream enters the first-stage pipeline in the pipeline architecture, said serial data stream then flows into the second-stage pipeline of the pipeline architecture in the next period.

6. The device of claim 5, wherein said position of the n-bit word data is the position of the second-stage pipeline corresponding to the position of the first-stage k-bit comma pattern.

7. A bit receiver for n-to-m bit reception and conversion in serial transmission, the bit receiver comprising:
   a pipeline architecture composed of a plurality of register sets with h-bit data width, which receives a serial data stream and has a first-stage pipeline and a second stage pipeline;
   a comma detection logical circuit, which detects the distribution of a k-bit comma pattern in the register sets of the first-stage pipeline when the serial data stream enters the first-stage pipeline; and
   a word alignment logical circuit, which extracts an n-bit word data in the register sets of the second-stage pipeline when the serial data streams enter the second-stage pipeline,
   wherein the locations of the n-bit word data are selected according to the location of the k-bit comma pattern in the second-stage pipeline, and the output data go through an n-to-m bit conversion to obtain an m-bit data.

8. The bit receiver of claim 7, wherein the pipeline architecture is comprised of D-type flip-flop.

9. The bit receiver of claim 7, wherein k<n.

10. The bit receiver of claim 9, wherein k=7, n=10, and m=8.

11. The bit receiver of claim 7, wherein after said serial data stream enters the first-stage pipeline in the pipeline architecture, said serial data stream then flows into the second-stage pipeline of the pipeline architecture in the next period.

12. The bit receiver of claim 11, wherein said position of the n-bit word data is the position of the first-stage k-bit comma pattern in the second stage pipeline.

13. A device for a pipeline architecture with a first-stage pipeline and a second-stage pipeline for n-to-m bit receiving and conversion of a serial data stream, the pipeline architecture composed of a plurality of register sets with h-bit data width, said device comprising:
   a comma detection logical circuit, which detects the distribution of a k-bit comma pattern in the register sets of the first-stage pipeline when the serial data stream enters the first-stage pipeline; and a word alignment logical circuit, which extracts an n-bit word datum in the register sets of the second-stage pipeline when the serial data stream enters the second-stage pipeline, wherein the locations of the n-bit word data are selected according to the location of the k-bit comma pattern in the second-stage pipeline, and the output data go through an n-to-m bit conversion to obtain a m-bit data.

14. The device for a pipeline architecture of claim 13, wherein k<n.

15. The device for a pipeline architecture of claim 13, wherein the location of the k-bit comma pattern in the first-stage pipeline is used to define the boundaries of a corresponding n-bit data frame in the second-stage pipeline.

16. A method of comma detection and word alignment for n-to-m bit conversion in serial transmissions, the method comprising:

detecting the distribution of a k-bit comma pattern when the serial data stream enters a first-stage pipeline in a two-stage pipeline architecture composed of a plurality of register sets with h-bit data width; and extracting an n-bit word data when the serial data stream enters a second-stage pipeline in the two-stage pipeline architecture;

wherein the locations of the n-bit word data are selected according to the locations of the k-bit comma pattern in the second-stage pipeline, and the output data go through an n-to-m bit conversion to obtain an m-bit data, wherein k<n and said location of the k-bit comma pattern in the first-stage pipeline is used to define the boundaries of a corresponding n-bit data frame in the second-stage pipeline.

17. The method of claim 16, wherein the extraction of the n-bit word data is achieved according to the n-bit boundaries of the data frame.

* * * * *